United States Patent
Tetelbaum (10) Patent No.: US 6,502,222 B1
(45) Date of Patent: Dec. 31, 2002

(54) METHOD OF CLOCK BUFFER PARTITIONING TO MINIMIZE CLOCK SKEW FOR AN INTEGRATED CIRCUIT DESIGN

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/875,314

(22) Filed: Jun. 4, 2001

Related U.S. Application Data (60) Provisional application No. 60/236,900, filed on Sep. 28, 2000.

(51) Int. Cl.[7] .............................. G06F 17/50; G06F 9/45
(52) U.S. Cl. ....................... 716/4; 716/6; 716/7; 716/9; 716/10
(58) Field of Search ................................ 716/4, 7, 6, 9, 716/10

(56) References Cited

U.S. PATENT DOCUMENTS

| | | | | |
|---|---|---|---|---|
| 5,036,230 A | * | 7/1991 | Bazes ........................ | 327/107 |
| 5,122,978 A | * | 6/1992 | Merrill ....................... | 702/79 |
| 5,272,390 A | * | 12/1993 | Watson et al. .............. | 327/141 |
| 5,272,729 A | * | 12/1993 | Bechade et al. ............. | 327/141 |
| 5,309,035 A | * | 5/1994 | Watson et al. .............. | 327/141 |
| 5,347,232 A | * | 9/1994 | Nishimichi ................. | 331/1 A |
| 5,369,640 A | * | 11/1994 | Watson et al. .............. | 307/409 |
| 5,452,239 A | * | 9/1995 | Dai et al. .................... | 703/19 |
| 5,564,022 A | * | 10/1996 | Debnath et al. ............. | 307/405 |
| 5,663,668 A | * | 9/1997 | Hayashi et al. ............. | 327/156 |
| 5,717,719 A | * | 2/1998 | Iknaian et al. .............. | 327/153 |
| 6,002,282 A | * | 12/1999 | Alfke .......................... | 327/149 |
| 6,199,183 B1 | * | 3/2001 | Nadaoka ..................... | 714/726 |
| 6,222,792 B1 | * | 4/2001 | Hanzawa et al. ........... | 365/194 |
| 6,271,697 B1 | * | 8/2001 | Hayashi et al. ............. | 327/158 |
| 6,381,704 B1 | * | 4/2002 | Cano et al. .................. | 710/58 |
| 6,381,719 B1 | * | 4/2002 | Schneck ...................... | 714/727 |
| 2001/0050585 A1 | * | 12/2001 | Carr ........................... | 327/277 |

FOREIGN PATENT DOCUMENTS

| | | | | |
|---|---|---|---|---|
| JP | 2000266818 A | * | 9/2000 | ........... G01R/31/28 |

\* cited by examiner

*Primary Examiner*—David Nelms
*Assistant Examiner*—Ly Duy Pham
(74) *Attorney, Agent, or Firm*—Fitch, Even, Tabin & Flannery (57) ABSTRACT

A method of clock buffer partitioning includes the steps of receiving as input a description of a number of clock buffers for buffering a system clock to a plurality of clocked circuit elements; constructing a balanced clock tree from the description wherein the balanced clock tree includes a plurality of buffers in a hierarchy of buffer levels; partitioning each of the hierarchy of buffer levels into a plurality of buffer groups wherein clock skew in each of the plurality of buffer groups at each buffer level is substantially minimized; routing a clock input to a plurality of buffers within at least one of the plurality of buffer groups in at least one of the hierarchy of buffer levels to construct a zero clock skew among the plurality of buffers; calculating an estimated group insertion delay for the at least one of the plurality of buffer groups as a sum of an internal insertion delay and a downstream insertion delay of one of the plurality of clocked circuit elements; and generating as output the estimated group insertion delay.

9 Claims, 5 Drawing Sheets

METHOD OF CLOCK BUFFER PARTITIONING TO MINIMIZE CLOCK SKEW FOR AN INTEGRATED CIRCUIT DESIGN

CROSS-REFERENCE TO RELATED APPLICATIONS

This application claims priority under 35 USC §119(e) to U.S. Provisional Patent Application Ser. No. 60/236,900 of Alexander Tetelbaum for METHOD FOR TOP LEVEL CLOCK CELL PARTITIONING, filed Sep. 28, 2000, incorporated herein by reference as if set forth in its entirety.

BACKGROUND OF THE INVENTION

The present invention relates generally to design tools for integrated circuits. More specifically, but without limitation thereto, the present invention relates to a method of distributing a clock signal among clock buffers in a balanced clock tree that minimizes clock skew for an integrated circuit design.

Integrated circuits typically include blocks or multiple circuit elements such as flip-flops. The circuit elements are generally synchronized by a common clock signal from clock buffer cells. The clock buffer cells are typically arranged in a balanced clock tree. A balanced clock tree is constructed in a hierarchy of buffer levels, and each buffer level contains one or more partitions of clock buffers. The top buffer level is the clock driver level, which contains a driver (a high power buffer cell) driven by a system clock. The next buffer level is the clock repeater level, which contains clock repeaters (medium power buffer cells) driven by the clock drivers. The remaining lower buffer levels contain clock buffers (standard power buffer cells) down to buffer level L1, which contains the clocked circuit elements.

In previous approaches to balanced clock placement, the number of clock buffers driven by repeaters is minimized, while insertion delays of buffers at each lower buffer level "downstream" are ignored. The inability to estimate maximum and minimum delays accurately in buffer groups results in unbalanced partitioning with large clock skew and insertion delays. The unbalanced partitioning typically requires delay balancing by extra wire insertion, resulting in large errors in Elmore delay calculations relative to SPICE delay calculations.

A circuit may be partitioned in a single iteration, called one-pass partitioning, or the circuit may be partitioned by an algorithm that examines all cells in several iterations. A partition of a circuit into two parts is called two-way cutting. Two-way cutting may be repeated to further partition a circuit so that each partition contains a set of cells or buffers having a minimum skew. One-pass partitioning based on two-way cutting does not generally produce good solutions to balanced clock placement in production designs.

Further, heuristic objective functions used to place clock buffers in groups of circuit elements result in a large clock skew. Heuristic objective functions are quality functions that describe an objective or goal indirectly. An example of a heuristic objective function used to place clock buffers in groups of circuit elements is the minimization of the distance between a buffer location and the center of mass of a group of cells driven by the buffer. The real objective of balanced clock buffer placement is the minimization of clock skew between the clock buffer and each cell in the group.

SUMMARY OF THE INVENTION

The present invention advantageously addresses the problems above as well as other problems by providing a method of clock buffer partitioning that minimizes clock skew for a balanced clock tree.

In one embodiment, the present invention may be characterized as a method of clock buffer partitioning to minimize clock skew in an integrated circuit design that includes the steps of receiving as input a description of a number of clock buffers for buffering a system clock to a plurality of clocked circuit elements; constructing a balanced clock tree from the description wherein the balanced clock tree includes a plurality of buffers in a hierarchy of buffer levels; partitioning each of the hierarchy of buffer levels into a plurality of buffer groups wherein clock skew in each of the plurality of buffer groups at each buffer level is substantially minimized; routing a clock input to a plurality of buffers within at least one of the plurality of buffer groups in at least one of the hierarchy of buffer levels to construct a zero clock skew among the plurality of buffers; calculating an estimated group insertion delay for the at least one of the plurality of buffer groups as a sum of an internal insertion delay and a downstream insertion delay of one of the plurality of clocked circuit elements; and generating as output the estimated group insertion delay.

In another embodiment, the present invention may be characterized as a a computer program product for clock buffer partitioning to minimize clock skew in an integrated circuit design that may be implemented by a computer to perform the following functions: receiving as input a description of a number of clock buffers for buffering a system clock to a plurality of clocked circuit elements; constructing a balanced clock tree from the description wherein the balanced clock tree includes a plurality of buffers in a hierarchy of buffer levels; partitioning each of the hierarchy of buffer levels into a plurality of buffer groups wherein clock skew in each of the plurality of buffer groups at each buffer level is substantially minimized; routing a clock input to a plurality of buffers within at least one of the plurality of buffer groups in at least one of the hierarchy of buffer levels to construct a zero clock skew among the plurality of buffers; calculating an estimated group insertion delay for the at least one of the plurality of buffer groups as a sum of an internal insertion delay and a downstream insertion delay of one of the plurality of clocked circuit elements; and generating as output the estimated group insertion delay.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Figure 1:
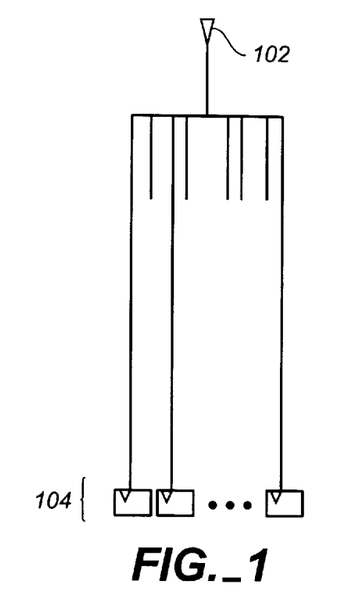
FIG. 1 is a diagram of an initial clock net of the prior art.

FIG. 1 is a diagram of a typical initial clock net for an integrated circuit design. Shown in FIG. 1 are a system clock driver 102 and clocked circuit elements 104. In a typical integrated circuit design, thousands of circuit elements 104 may be clocked by the system clock driver 102. However, the system clock driver 102 lacks sufficient drive power to drive more than, for example, 10 circuit elements, or cells. The drive power is typically provided by a hierarchy of clock buffer levels arranged in a balanced clock tree.

Figure 2:
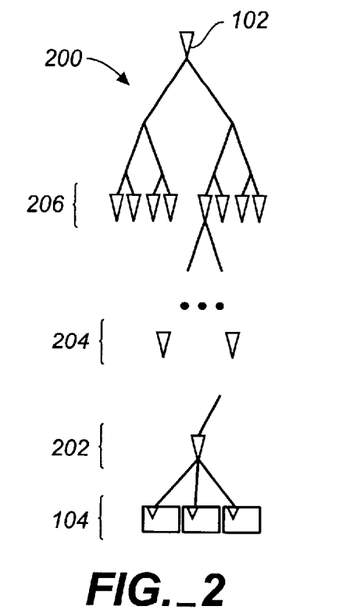
FIG. 2 is a diagram of a balanced clock tree for the clock net of FIG. 1.

FIG. 2 is a diagram of a balanced clock tree 200 for the clock net of FIG. 1. Shown in FIG. 2 are a system clock driver 102, clocked circuit elements 104 at level 0 (L0), level 1 (L1) buffers 202, level 2 (L2) buffers 204, and repeater level repeaters 206.

At the lowest level L0 of the balanced clock tree 200, the clocked circuit elements 104 are driven in groups by L1 buffers 202. In this example, the size of each group of clocked circuit elements 104 is three, however, other group sizes may be selected to suit specific applications and buffer drive levels.

The L1 buffers 202 are partitioned into buffer groups, and each buffer group is driven by one of L2 buffers 204. The L2 buffers 204 are likewise partitioned into buffer groups, and so on, up through the repeater level and the top buffer level.

Figure 3:
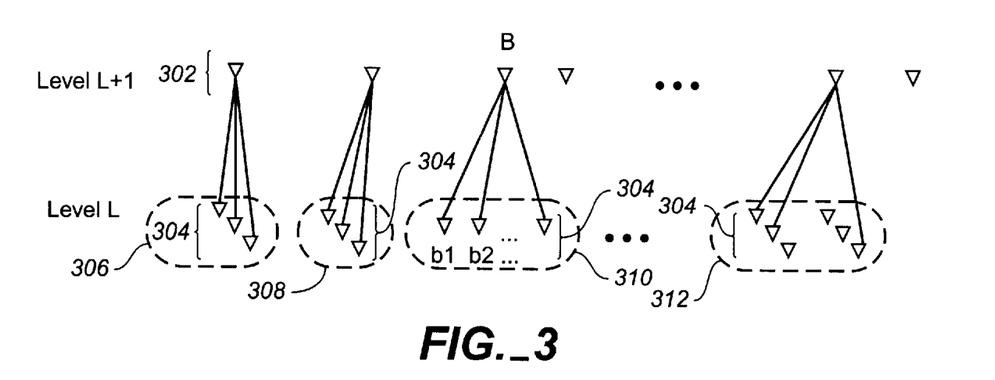
FIG. 3 is a diagram of a clock buffer partition of the balanced clock tree of FIG. 2.

FIG. 3 is a diagram of a clock buffer partition of the balanced clock tree of FIG. 2. Shown in FIG. 3 are buffer level L+1 buffers 302, buffer level L buffers 304, and buffer groups 306, 308, 310, and 312. Each partition represents a number of buffer groups in a buffer level L in which each buffer group is driven by a buffer in the next higher buffer level L+1.

Figure 4:
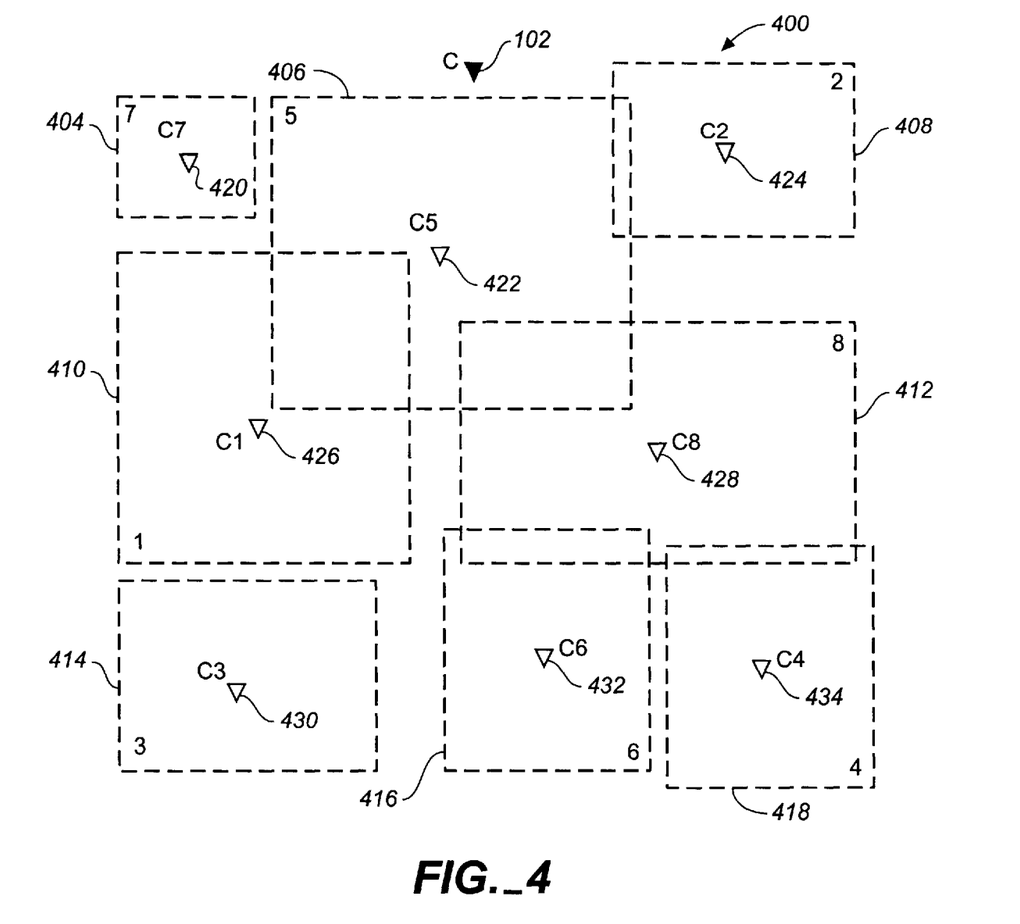
FIG. 4 is a diagram of a top level partition of a balanced clock tree according to an embodiment of the present invention.

FIG. 4 is a diagram of a top level partition 400 of a balanced clock tree according to an embodiment of the present invention. Shown in FIG. 4 are a system clock driver 102, buffer groups 404, 406, 408, 410, 412, 414, 416, and 418, and clock repeaters 420, 422, 424, 426, 428, 430, 432, and 434. As explained above with reference to FIG. 2, a balanced clock tree is typically constructed in a hierarchy of several buffer levels. The top buffer level is the clock driver level, which contains the system clock driver 102. The next level is the clock repeater level, which contains clock repeaters (medium power buffer cells) that are driven by the system clock driver 102. The remaining lower levels contain clock buffers (standard power buffer cells) down to the lowest level L0, which contains the clocked circuit elements 104.

In this example, the top level partition 400 contains eight buffer groups, however, other numbers of buffer groups may be partitioned, depending on the drive power of the clock drivers and repeaters in the buffer groups. The number of buffer groups K in a partition is preferably $K=2^n$, where n is a positive integer. For example, K may equal 16, 8, 4, or 2.

The primary objective of the top level partition 400 is to achieve a minimum clock skew at the top buffer level. The clock skew of the top level is defined as the maximum of the difference in insertion delays between each pair of buffer groups in the top level partition 400. For example, if the insertion delay of buffer group 404 is 50 picoseconds, and the insertion delay of buffer group 406 is 75 picoseconds, then the difference in insertion delay between the pair of buffer groups 404 and 406 is equal to 25 picoseconds. If the difference in insertion delays between the pair of buffer groups 404 and 406 is greater than or equal to the difference between the pair of buffer groups 404 and 408, 404 and 410, and so on for each pair of buffer groups in the partition of buffer groups 404, 406, 408, 410, 412, 414, 416, and 418, then the clock skew of the top level is equal to 25 picoseconds.

In the method of the present invention, classical iterative partitioning based on a pair-wise swap of clock buffers or a single move of a clock buffer from one buffer group to another at the buffer level L2 is used to minimize clock skew at the top buffer level. Zero clock skew is achieved within each of the buffer groups by zero balanced routing according to well known techniques. The insertion delay for each buffer group and the clock skew for each partition of buffer groups are calculated, and the partition that has the smallest maximum insertion delay among buffer groups and the minimum clock skew is selected as the top level buffer partition. An important feature of the present invention is the inclusion of estimated insertion delays to the buffer groups in the top buffer level from the clocked circuit elements at the L0 level.

Figure 5:
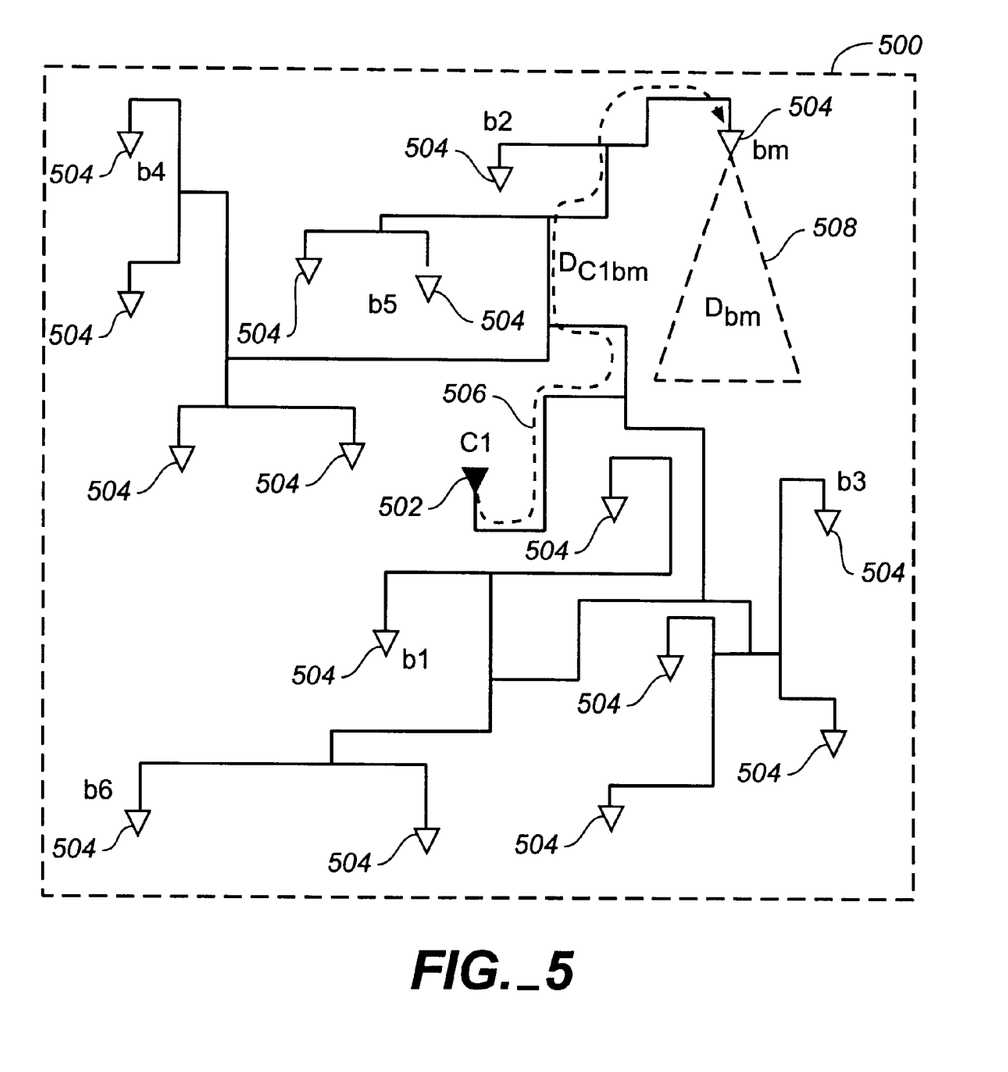
FIG. 5 is a detailed diagram of one of the buffer groups within the top level partition illustrated in FIG. 4.

FIG. 5 is a detailed diagram illustrating an example of a buffer group 500 within the top level partition 400 illustrated in FIG. 4. Shown in FIG. 5 are a clock repeater 502, buffers 504, an internal insertion delay 506, and a downstream insertion delay 508.

The clock repeater 502 is generally located at a center (or mass center) of the buffer group 500. The buffers 504 are distributed within the area enclosed by the buffer group 500 and are routed to the clock repeater 502 by a zero balanced routing tree according to well known balanced routing techniques.

The insertion delay 506 from the clock repeater 502 to the clocked circuit element downstream at level L0 having the longest insertion delay from the buffer group 500 defines the buffer group insertion delay of the buffer group 500. The insertion delay within the buffer group 500 is equal to the sum of the delay from the clock repeater 502 to the corresponding buffer 504, shown as the internal insertion delay 506, and the downstream delay from the corresponding buffer 504 to the clocked circuit element, shown as the downstream insertion delay 508. The insertion delay within the buffer group 500 may be expressed by the following formula:

$$D_{C1bmff} = D_{C1bm} + D_{bm} \tag{1}$$

where $D_{C1bmff}$ is the insertion delay within the buffer group 500, $D_{C1bm}$ is the internal insertion delay 506, and $D_{bm}$ is the downstream insertion delay 508.

The downstream insertion delay 508 may be calculated according to well known techniques and propagated back to buffer group 500. The internal insertion delay 506 is the same to each buffer 504 due to zero balanced routing, therefore the Elmore modeled clock skew within the buffer group 500 will be zero by construction. The actual clock skew will not be zero, because the actual clock skew equals accumulated clock skew from levels L1 and L2 plus Elmore error clock skew.

The buffer group insertion delay from the clock repeater 502 to the clocked circuit elements 104 for the buffer group 500 may be defined by the following relation:

$$D_1 = D_{CC1} + D_{C1bmff} \tag{2}$$

where $D_{CC1}$ is the delay from the system clock driver to the clock repeater 502. The estimation of the delay $D_{CC1}$ depends on the geometrical location of the system clock driver 102 and the clock repeater 502, and may be performed using, for example, the Elmore model. The delay $D_{C1bmff}$ depends on the number of levels from the clock repeater 502 to the clocked circuit elements 104, that is, the number of buffers between the clock repeater 502 and the clocked circuit elements 104. The insertion delay from the clock driver to the clocked circuit element downstream having the longest insertion delay for the buffer group 500 may be expressed as follows:

$$D_1 = D_{CC1} + \max\{D_{C1ff}\} \quad (3)$$
$$= D_{CC1} + D_{CC1bmff}$$
$$= D_{CC1} + D_{CC1b} + \max\{D_b\}$$

where $D_{CC1}$ is the delay from the system clock driver 102 to repeater C1, and $D_{C1ff}$ is the delay from repeater C1 to the clocked circuit element downstream. Similar calculations are performed for each repeater $C_i$ in each of the buffer groups. The index i has a value ranging from 1 to the total number of buffer groups, which is eight in the example illustrated below. The total number of buffer groups appropriate for a specific application depends on, for example, the drive power of the clock drivers and repeaters in the buffer groups.

The buffer group clock skew at the top level is the maximum of the difference in insertion delays between each pair of buffer groups, which is given by the following relation:

$$S=\max\{|D_1-D_2|,|D_1-D_3|,\ldots,|D_7-D_8|\} \quad (4)$$

The eight-way partition of clock buffers at the L2 level that has the minimum value of clock skew S is the repeater level partition, which is the top level partition connected to the system clock driver 102.

Figure 6A:
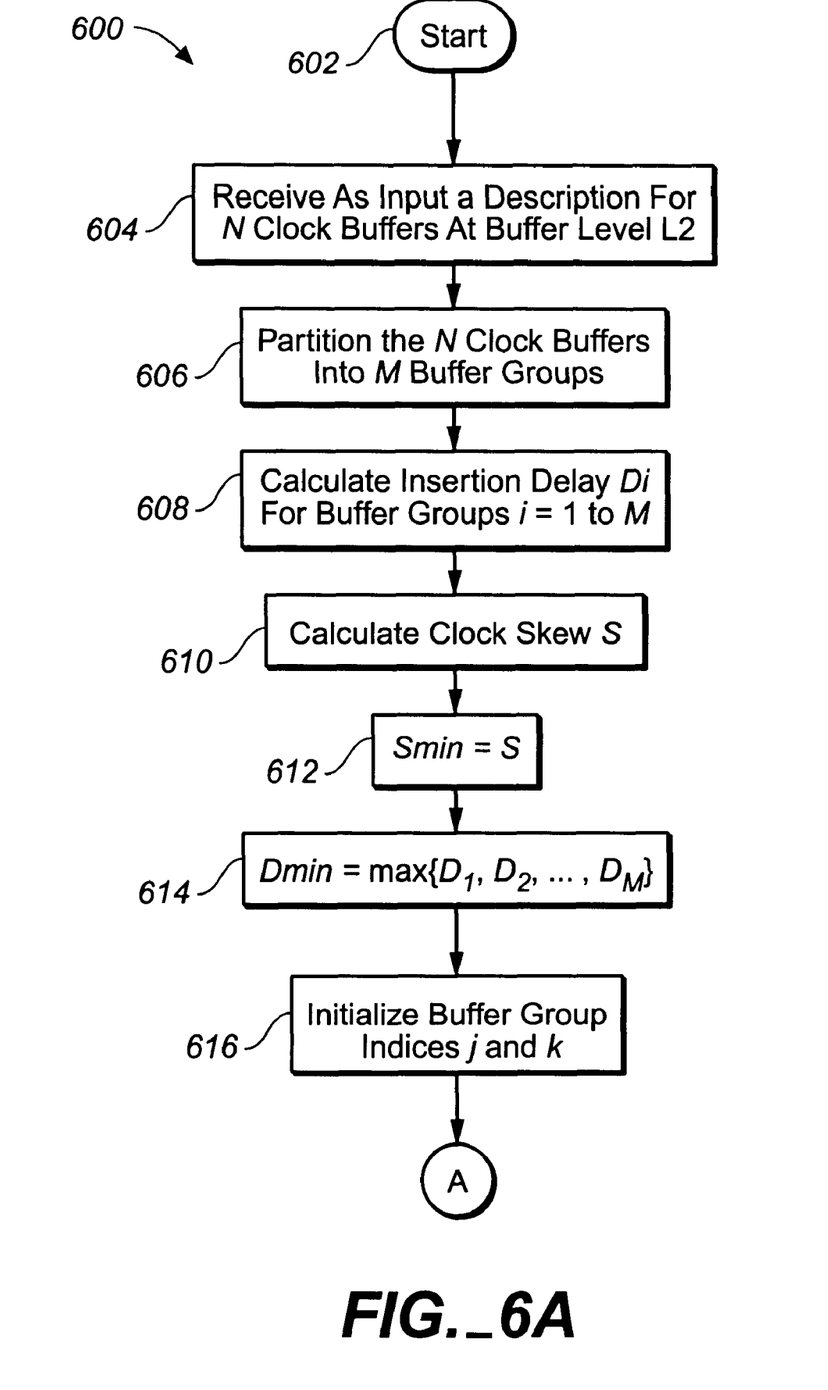
FIGS. 6A and 6B illustrate a flowchart of a method for partitioning an L2 buffer level into buffer groups to minimize clock skew according to an embodiment of the present invention.
Figure 6B:
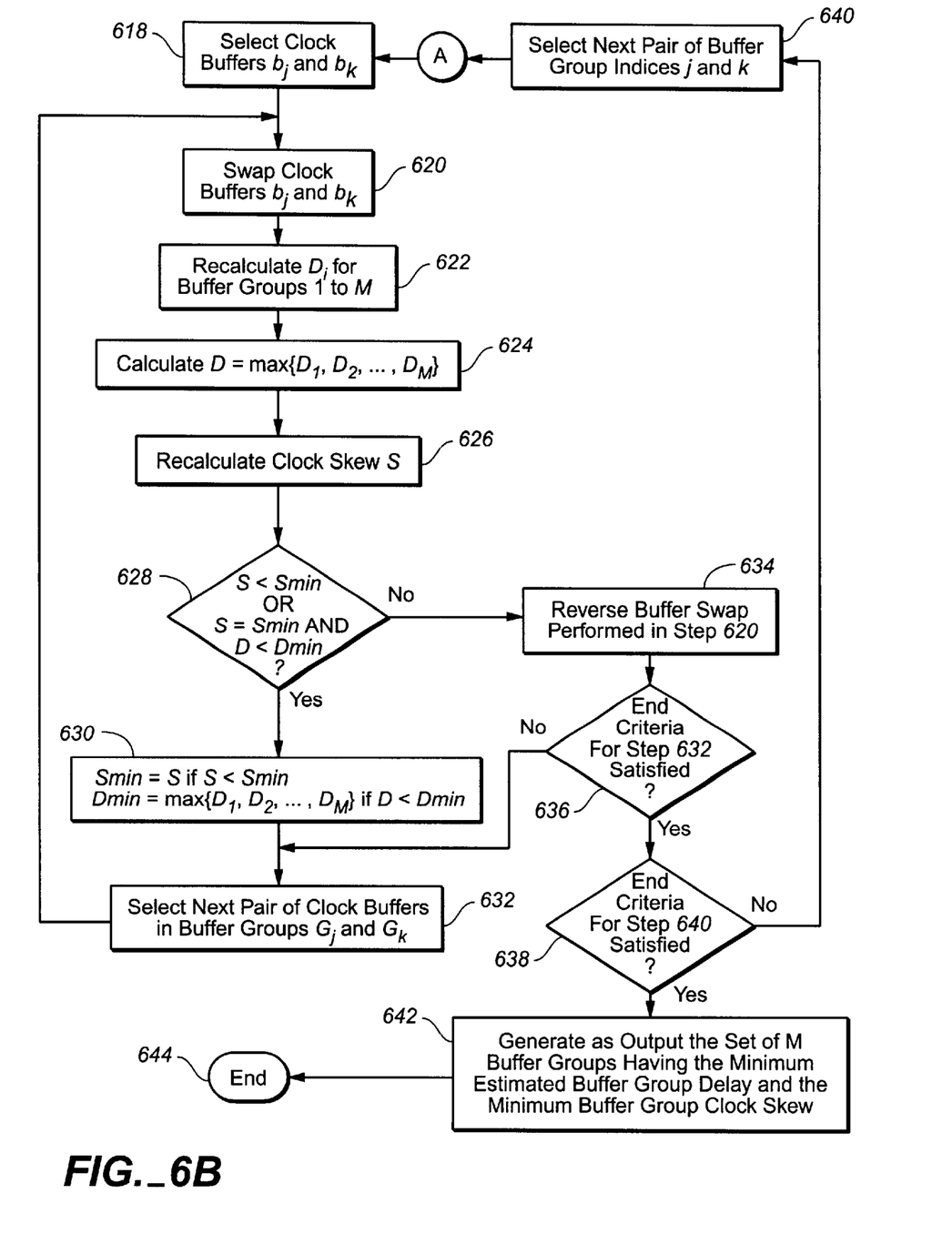

FIGS. 6A and 6B illustrate a flowchart 600 of a method for partitioning an L2 buffer level into buffer groups to minimize clock skew according to an embodiment of the present invention.

Step 602 is the entry point of the flowchart 600.

In step 604, a description, for example, a netlist, of a number of clock buffers N at the L2 buffer level is received as input.

In step 606, the N clock buffers are initially partitioned into M buffer groups $G_1, G_2, \ldots, G_M$.

In step 608, the corresponding insertion delay $D_i$ for i=1,M is calculated for each buffer group as described for formula (3).

In step 610, the buffer group clock skew S is calculated for the L2 buffer level as described above for formula (4).

In step 612, $S_{MIN}$ is set equal to S.

In step 614, $D_{MIN}$ is set equal to $\max\{D_1, D_2, \ldots, D_M\}$.

In step 616, a first buffer group index j is set equal to 1, and a second buffer group index k is set equal to 2.

In step 618, a first clock buffer $b_j$ in buffer group $G_j$ and a second clock buffer $b_k$ in buffer group $G_k$ are selected. An individual clock buffer in buffer group $G_j$ is represented as $G_j[1,2,\ldots]$. For example, a swap of the first buffer $b_j$ and the second buffer $b_k$ may be expressed as $G_j[1] \leftrightarrows G_k[2]$. To indicate a move of a clock buffer between one buffer group and another instead of a swap, $G_j[0]$ or $G_k[0]$ is used to indicate the buffer group to which a clock buffer is being moved. For example, $G_j[0] \leftrightarrows G_k[1]$ indicates that the first clock buffer of buffer group $G_k$ is being moved to buffer group $G_j$. The first clock buffer $b_j$ is therefore one of $G_j[0,1,2,\ldots]$ and the second clock buffer $b_k$ is one of $G_k[0,1,2,\ldots]$.

In step 620, the first clock buffer $b_j$ is swapped with the second clock buffer $b_k$.

In step 622, $D_i$ for i=1,M is recalculated.

In step 624, $D=\max\{D_1, D_2, \ldots, D_M\}$ is calculated.

In step 626, the buffer group clock skew S is recalculated.

In step 628, the buffer group clock skew S is compared to $S_{MIN}$, and D is compared to $D_{MIN}$. If $S<S_{MIN}$ OR if $S=S_{MIN}$ AND $D<D_{MIN}$, then processing continues at step 630. Otherwise, processing continues at step 634.

In step 630, $S_{MIN}$ is set equal to S (if S is less than $S_{MIN}$), and $D_{MIN}$ is set equal to D (if D is less than $D_{MIN}$). Each iteration that reduces $S_{MIN}$ or $D_{MIN}$ in the L2 buffer partition reduces the clock skew in the top level partition.

In step 632, the next pair of clock buffers in buffer groups $G_j$ and $G_k$ is selected and processing continues from step 620.

In step 634, the buffer swap performed in step 620 is reversed.

In step 636, the criteria for ending the iteration from step 632 is checked. The criteria may be, for example, a limit on the total number of swaps that corresponds to the maximum allowable processing time and/or the number of swaps performed without further reducing $S_{MIN}$ or $D_{MIN}$. If the criteria for ending the ending the iteration from step 632 are satisfied, then processing continues at step 638. Otherwise, processing continues at step 632.

In step 638, the criteria for ending the iteration from step 640 are checked. The criteria may be, for example, a limit on the total number of iterations of all pairs of buffer groups that corresponds to the maximum allowable processing time and/or the number of iterations performed without further reducing $S_{MIN}$ or $D_{MIN}$. If the criteria for ending the iteration from step 640 are satisfied, then processing continues at step 642. Otherwise, processing continues at step 640.

In step 640, the first buffer group index j and the second buffer group index k are set to the next pair of buffer groups and processing continues from step 618.

In step 642, the set of M buffer groups having the minimum estimated buffer group delay and the minimum buffer group clock skew is generated as.output.

Step 644 is the exit point for the flowchart 600.

Although the method illustrated by the flowchart 600 has been described and shown with reference to specific steps performed in a specific order, these steps may be combined, sub-divided, or reordered without departing from the scope of the claims. Unless specifically indicated herein, the order and grouping of steps is not a limitation of the present invention.

The method of minimizing clock skew in a top buffer level of an integrated circuit design illustrated by the flowchart 600 above may be embodied in a computer program product and implemented by a computer according to well known programming techniques to perform the following functions: (a) receiving as input a description of a number of clock buffers for buffering a system clock to a plurality of clocked circuit elements; (b) constructing a balanced clock tree from the description wherein the balanced clock tree includes a plurality of buffers in a hierarchy of buffer levels; (c) partitioning each of the hierarchy of buffer levels into a plurality of buffer groups wherein clock skew in each of the plurality of buffer groups at each buffer level is substantially minimized; (d) routing a clock input to a plurality of buffers within at least one of the plurality of buffer groups in at least one of the hierarchy of buffer levels to construct a zero clock skew among the plurality of buffers; (e) calculating an estimated group insertion delay for the at least one of the plurality of buffer groups as a sum of an internal insertion delay and a downstream insertion delay of one of the plurality of clocked circuit elements; and (f) generating as output the estimated group insertion delay.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of clock buffer partitioning in an integrated circuit design comprising the steps of:
   (a) receiving as input a description of a number of clock buffers for buffering a system clock to a plurality of clocked circuit elements;
   (b) constructing a balanced clock tree from the description wherein the balanced clock tree includes a plurality of buffers in a hierarchy of buffer levels;
   (c) partitioning each of the hierarchy of buffer levels into a plurality of buffer groups wherein clock skew in each of the plurality of buffer groups at each buffer level is substantially minimized;
   (d) routing a clock input to a plurality of buffers within at least one of the plurality of buffer groups in at least one of the hierarchy of buffer levels to construct a zero clock skew among the plurality of buffers;
   (e) calculating an estimated group insertion delay for the at least one of the plurality of buffer groups as a sum of an internal insertion delay and a downstream insertion delay of one of the plurality of clocked circuit elements; and
   (f) generating as output the estimated group insertion delay.

2. The method of claim 1 wherein the least one of the plurality of buffer groups belongs to a top buffer level.

3. A method of clock buffer partitioning in an integrated circuit design comprising the steps of:
   (a) receiving as input a description of a number of clock buffers for buffering a system clock to a plurality of clocked circuit elements;
   (b) constructing a balanced clock tree from the description wherein the balanced clock tree includes a plurality of buffers in a hierarchy of buffer levels;
   (c) partitioning each of the hierarchy of buffer levels into a plurality of buffer groups wherein clock skew in each of the plurality of buffer groups at each buffer level is substantially minimized;
   (d) routing a clock input to a plurality of buffers within at least one of the plurality of buffer groups in at least one of the hierarchy of buffer levels to construct a zero clock skew among the plurality of buffers;
   (e) calculating an estimated group insertion delay for the at least one of the plurality of buffer groups as a sum of an internal insertion delay and a downstream insertion delay of one of the plurality of clocked circuit elements; and
   (f) generating as output the estimated group insertion delay wherein step (c) includes the following steps:
      (c1) forming an initial set of M buffer groups at an L2 level wherein M is a positive integer;
      (c2) calculating a group insertion delay for each of the M buffer groups;
      (c3) calculating a clock skew between each pair of buffer groups in the set of M buffer groups;
      (c4) setting a minimum clock skew equal to a maximum of clock skews calculated in step (c3);
      (c5) setting a minimum estimated group delay equal to a maximum of group insertion delays calculated in step (c2);
      (c6) selecting an initial first buffer group and an initial second buffer group representative of a pair of buffer groups in the set of M buffer groups;
      (c7) selecting a first clock buffer in the first buffer group and a second clock buffer in the second buffer group;
      (c8) moving at least one of the first clock buffer and the second clock buffer from one buffer group of the pair of buffer groups to another of the pair of buffer groups;
      (c9) calculating a group insertion delay for the first buffer group and the second buffer group;
      (c10) calculating a maximum of group insertion delays for the set of M buffer groups;
      (c11) calculating a clock skew between the first buffer group and the second buffer group;
      (c12) if the maximum of group insertion delays calculated in step (c10) is less than the minimum estimated group delay and the clock skew calculated in step (c11) is equal to the minimum clock skew, or if the clock skew calculated in step (c11) is less than the minimum clock skew, then continuing from step (c13), otherwise continuing from step (c15);
      (c13) setting the minimum clock skew to the clock skew calculated in step (c11) and setting the minimum estimated group delay equal to the maximum of group insertion delays calculated in step (c10);
      (c14) selecting a next first clock buffer in the first buffer group and a next second clock buffer in the second buffer group and continuing from step (c8);
      (c15) reversing the buffer swap of step (c8);
      (c16) if end criteria for iterating from step (c14) are satisfied, then continuing from step (c17), otherwise continuing from step (c14);
      (c17) if end criteria for iterating from step (c18) are satisfied, then continuing from step (c19), otherwise continuing from step (c18);
      (c18) selecting another pair of buffer groups in the set of M buffer groups and continuing at step (c7); and
      (c19) generating as output the set of M buffer groups having the minimum estimated group delay and a minimum buffer group clock skew.

4. The method of claim 3 wherein the end criteria include a limit on a total number of iterations of all pairs of buffer groups corresponding to at least one of a maximum allowable processing time and a number of iterations performed without further reducing the minimum clock skew.

5. The method of claim 3 wherein step (c2) includes calculating the group insertion delay for one of the M buffer groups substantially according to the formula:

$$D_1 = D_{CC1} + \max\{D_{C1ff}\}$$
$$= D_{CC1} + D_{CC1bmff}$$
$$= D_{CC1} + D_{CC1b} + \max\{D_b\}$$

wherein $D_{CC1}$ is a delay from a system clock driver to a clock repeater C1, $D_{C1ff}$ is a delay from the clock repeater C1 to a clocked circuit element downstream, $D_{C1bmff}$ is an insertion delay within the one of the M buffer groups, $D_{C1b}$ is an internal insertion delay, and $D_b$ is a downstream insertion delay.

6. The method of claim 5 wherein the clock repeater C1 is located at a mass center of the one of the M buffer groups.

7. The method of claim 6 wherein $D_{CC1}$ is estimated from a geometrical location of the system clock driver and the clock repeater C1.

8. The method of claim 3 wherein step (c10) includes calculating the maximum of group insertion delays S for the set of M buffer groups substantially according to the formula:

$$S=\max\{|D_1-D_2|,|D_1-D_3|,\ldots,|D_{M-1}-D_M|\}$$

wherein $D_1, D_2, \ldots, D_{M-1}, D_M$ are the group insertion delays calculated in step (c2) respectively for each of the M buffer groups.

9. The method of claim 3 wherein M equals $2^n$ and n is a positive integer.

* * * * *